United States Patent
Seckin et al.

(10) Patent No.: US 10,756,744 B1
(45) Date of Patent: Aug. 25, 2020

(54) LINEARITY IMPROVEMENT FOR SEGMENTED R-DACS

(71) Applicant: Apple Inc., Cupertino, CA (US)

(72) Inventors: Utku Seckin, Santa Clara, CA (US); Simone Gambini, San Francisco, CA (US); Michael D. Scott, Portland, OR (US)

(73) Assignee: Apple Inc., Cupertino, CA (US)

(*) Notice: Subject to any disclaimer, the term of this patent is extended or adjusted under 35 U.S.C. 154(b) by 0 days.

(21) Appl. No.: 16/515,961

(22) Filed: Jul. 18, 2019

(51) Int. Cl.
*H03M 1/06* (2006.01)
*H03M 1/78* (2006.01)

(52) U.S. Cl.
CPC ............ *H03M 1/0612* (2013.01); *H03M 1/78* (2013.01); *H03M 1/785* (2013.01)

(58) Field of Classification Search
CPC ....... H03M 1/0612; H03M 1/78; H03M 1/785
USPC .......................................... 341/118, 144, 145
See application file for complete search history.

(56) References Cited

U.S. PATENT DOCUMENTS

| | | | |
|---|---|---|---|
| 9,178,524 B1* | 11/2015 | Lee | ................. H03M 1/0612 |
| 9,413,381 B2 | 8/2016 | Vasani et al. | |
| 9,941,897 B1 | 4/2018 | Li et al. | |
| 2014/0313066 A1 | 10/2014 | Dempsey | |

OTHER PUBLICATIONS

Wenjuan Guo, et al., An Area- and Power-Efficient Iref Compensation Technique for Voltage-Mode R—2R DACs, IEEE Transactions on Circuits and Systems—II: Express Briefs, Vol. 62, No. 7, Jul. 2015, pp. 656-660.*

* cited by examiner

*Primary Examiner* — Khai M Nguyen
(74) *Attorney, Agent, or Firm* — Kowert, Hood, Munyon, Rankin & Goetzel, P.C.

(57) ABSTRACT

Various embodiments of a segmented R-DAC are disclosed. In one embodiment, a segmented R-DAC includes first and second DACs arranged to receive most and least significant bits, respectively. The segmented R-DAC also includes a first capacitor coupled between an output of the first DAC and an output of the second DAC, and a second capacitor coupled between the output of the second DAC and a ground node. The capacitance of the second capacitor has a value that is a predetermined multiple of the capacitance value of the first capacitor.

20 Claims, 8 Drawing Sheets

US 10,756,744 B1

LINEARITY IMPROVEMENT FOR SEGMENTED R-DACS

BACKGROUND

Technical Field

This disclosure is directed to electronic circuits, and more particularly, to digital-to-analog conversion circuits.

Description of the Related Art

Digital-to-analog converters (DACs) are used in a wide variety of applications in which digital data is converted to an analog format. Such applications include wireless transceivers, audio circuits, and so on.

Resistor-DACs (R-DACs) are one type of widely used DAC topology. An R-DAC may use a ladder of resistors, and may receive digital input data that is thermometer coded. Advantages provided by R-DACs include low power consumption, low propensity to glitches, high linearity, good monotonicity, and small area. Segmented R-DACs divide the input data into a group of least significant bits (LSBs) and a group of most significant bits (MSBs). In a segmented R-DAC, separate DACs are provided to convert the MSBs and LSBs into analog format, where they are summed into a single analog signal thereafter. Utilizing separate DACs for the MSBs and LSBs may reduce the number of resistors needed to convert a given digital thermometer coded value into analog than a single DAC for the entire value. Reducing the number of resistors required for the conversion of a digital value into analog may further reduce the area consumed by an R-DAC relative to an unsegmented R-DAC.

SUMMARY

Various embodiments of a segmented R-DAC are disclosed. In one embodiment, a segmented R-DAC includes first and second DACs arranged to receive most and least significant bits, respectively. The segmented R-DAC also includes a first capacitor coupled between an output of the first DAC and an output of the second DAC, and a second capacitor coupled between the output of the second DAC and a ground node. The capacitance of the second capacitor has a value that is a predetermined multiple of the capacitance value of the first capacitor.

In one embodiment, the segmented R-DAC is coupled to receive 2N bits, where N is an integer value. The first DAC receives the N most significant bits of the 2N-bit digital value, while the second DAC receives the N least significant bits of the 2N-bit digital value. Furthermore, the second capacitor has a capacitance value that is $(2^N-1)$ times the capacitance value of the first capacitor. For example, if in a particular embodiment, N=6, and thus $2^N=64$, $2^N-1=63$, and the capacitance of the second capacitor is 63 times the capacitance value of the first capacitor.

In some embodiments, a segmented R-DAC includes a first replica DAC and a second replica DAC, along with first and second mapping logic circuits coupled respectively to the first and second replica DAC. During operation, the first mapping logic circuit receives the most significant bits of the digital value and generates a first code, while the second mapping logic circuit receives the least significant bits and generates a second code. The first code is provided to the first replica DAC, while the second code is provided to the second replica DAC. During operation, the first and second replica DACs compensate for variations in a reference current provided to the first and second DACs. Accordingly, the overall variation of the reference current may be significantly reduced.

BRIEF DESCRIPTION OF THE DRAWINGS

The following detailed description makes reference to the accompanying drawings, which are now briefly described.

Figure 1:
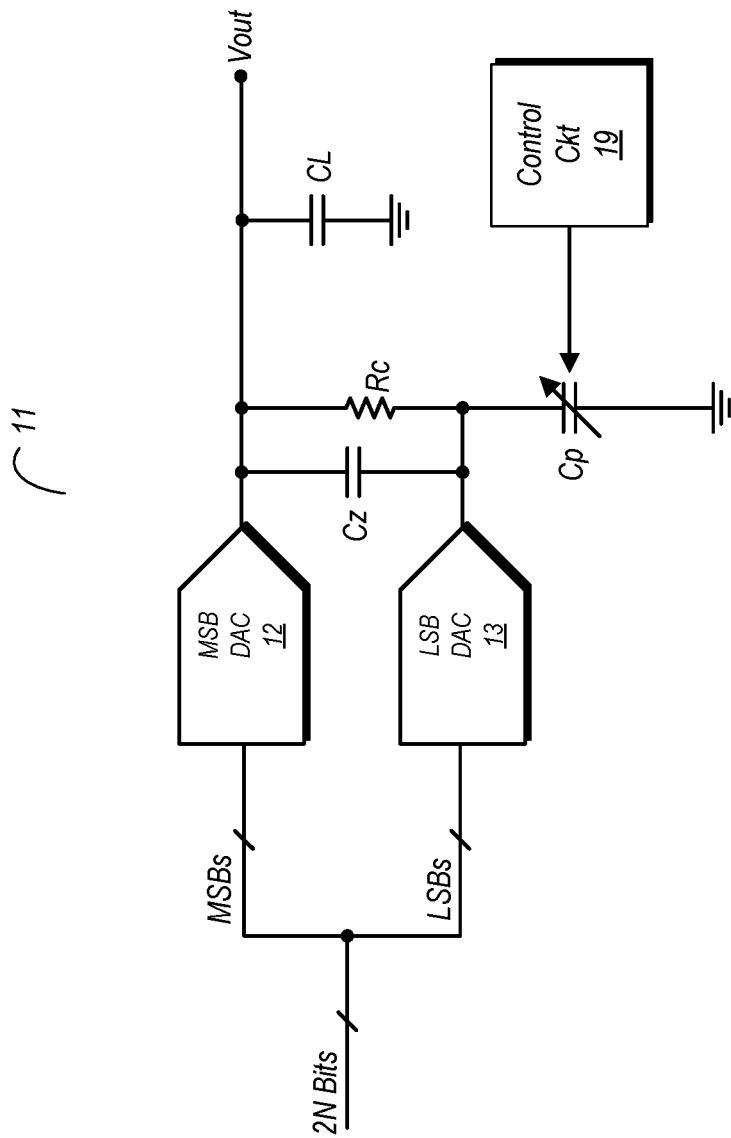
FIG. 1 is a schematic diagram of one embodiment of a segmented R-DAC.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks] is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

The present disclosure is directed to various techniques for improving the linearity in segmented R-DACs. While segmented R-DACs have certain advantages over other types of DACs (low power consumption, good monotonicity, small area, etc.), they are nevertheless subject to certain design challenges that can affect their linearity.

One of these challenges is matching the core transfer functions of an MSB DAC and an LSB DAC. This difficulty in matching transfer functions is caused by certain parasitic capacitances of the resistor networks that implement the DAC. These parasitic capacitances can cause the MSB DAC and LSB DAC to have unequal transfer functions with respect to on another, thereby causing distortion in each evaluation cycle. Operating a segmented R-DAC at high frequency can exacerbate this problem since the operational frequency can approach frequencies corresponding to poles and zeros in the transfer functions.

Another problem with segmented R-DACs is that there is a signal-dependent current load on a reference voltage that is provided to the MSB and LSB DACs. For different input codes, the resistor string of each DAC forms a different resistance between the reference voltage and ground. Accordingly, a variable reference load current can result in distortion at the output of a segmented R-DAC, as the reference voltage is modulated by the input signal.

The present disclosure contemplates solutions for both of these problems. These solutions may be implemented together, or separately from one another. Using one or both of these solutions may significantly enhance the linearity of the segmented R-DACs in which they are implemented.

With regard to the problem of the parasitic capacitances, the present disclosure contemplates adding capacitances in parallel and controlling the ratio of capacitance between one capacitor and another. In the past, the problem of parasitic capacitance has been approached with the goal of minimization. However, it is difficult to eliminate these parasitic capacitances. Instead, the approach of the present disclosure is to add capacitors in parallel with these parasitic capacitances to control their values. As will be demonstrated below, if the ratio of a capacitance associated with a pole of a DAC transfer function can be controlled relative to a capacitance associated with a zero, the distortion of the output signal due to the parasitic capacitances can be minimized, if not eliminated altogether. In one embodiment, this is accomplished by adding a fixed capacitance in parallel with the parasitic capacitance associated with a transfer function zero, while adding a variable capacitance in parallel with the parasitic capacitance associated with a transfer function pole. The variable capacitance can then be set to control the ratio, and may be varied to compensate for process, voltage, and temperature variations in order to maintain the ratio.

With regard to the problem of the modulated reference current, the present disclosure contemplates an arrangement in a segmented R-DAC in which replica DACS are provided (one corresponding to an MSB DAC and another corresponding to an LSB DAC). Mapping logic generates an input code to each of the replica DACs based on the MSB and LSB of the digital value that is being converted to analog. Responsive to the codes, the replica DACS generate compensation currents that are combined with the reference currents drawn by the MSB and LSB DACS. The sum of these currents is the total reference current, and this value may be kept to a stable value and constant within a specified range. Accordingly, the dependency of the reference current on the input values to the MSB and LSB DACs may be significantly reduced if not eliminated.

FIG. 1 is a schematic diagram of one embodiment of a segmented R-DAC. In the embodiment shown, R-DAC 11 includes a MSB DAC 12 and an LSB DAC 13. Each of MSB DAC 12 and LSB DAC 13 may be implemented using an R-2R ladder that may be used in implementing DACs. MSB DAC 12 in the embodiment shown includes the MSBs of a digital value having 2N bits, which may, in one embodiment, be a thermometer encoded digital value (e.g., the value includes a number of consecutive logic 1's and consecutive logic 0's). Similarly, LSB DAC 13 of the digital value of 2N bits. In one embodiment, each of MSB 12 and LSB DAC 13 each receive N bits of the 2N bit digital value. Furthermore, the circuit topology of MSB DAC and LSB DAC may be identical in terms of circuit topology. However, it is noted that embodiments are possible and contemplated where the number of bits received by each of MSB DAC 12 and LSB DAC 13 are not equal and wherein their respective circuit topologies are not equivalent to one another.

Each of MSB DAC 12 and LSB DAC 13 in the embodiment shown outputs an analog signal corresponding to digital value received thereby. The analog output signal from LSB DAC 13 is pass through coupling resistor Rc to the output node of MSB DAC 12. There, the output signal from LSB DAC 13 is summed, in the analog domain, with the analog output signal from MSB DAC 12. Accordingly, the final analog output signal from R-DAC 11, as conveyed on node Vout, is the sum of the analog output signals from MSB DAC 12 and LSB-DAC 13.

FIG. 1 illustrates a load capacitor CL implemented between the output node, Vout, and ground. This capacitor represents the capacitance of the load to which the analog output signal of R-DAC 11 is provided. It is noted that this capacitance typically does not cause distortion of the analog output signal of R-DAC 11.

In the embodiment shown, pole and zero capacitors are implemented. Zero capacitor Cz is implemented in parallel with the coupling resistor, Rc. Meanwhile, the pole capacitor, Cp, is coupled between the output node of LSB DAC 13 and a ground node (or more generally, reference node). Although parasitic capacitances exist in the positions of Cz and Cp, the capacitors depicted here are actual, discrete capacitors added to the circuit. It is noted that, on an integrated circuit die, these capacitors may be implemented using transistors connected as capacitors (e.g., the source and drain terminals connected to one another), although this is not a requirement for all embodiments.

The addition of actual, discrete capacitors for Cz and Cp may allow the capacitance between the connected nodes—and thus the ratio of capacitance values—to be controlled. Past designers of R-DACs have focused on attempting to minimize the parasitic capacitances in the positions of Cz and Cp, in order to reduce distortion of the output signal resulting therefrom. However, the ability to control these parasitic capacitances is limited, and thus can limit the performance of R-DAC embodiments subject to these capacitances. The various embodiments of R-DAC 11 disclosed herein take a different approach, namely to add capacitances across the affected nodes and then control the ratio of one to the other. In one embodiment, capacitor Cp may be set to a value that is $(2^N-1)$ times that of Cz. For example, if N=6, $2^i$=64, and thus Cp may have a capacitance value of 63 times that of Cz. The mathematical derivation of these value is discussed below in further detail.

In the embodiment shown, pole capacitor Cp is implemented as a variable capacitor. R-DAC 11 in this embodiment includes a control circuit 19 that is used to set the value of Cp and make adjustments to maintain the value of this capacitor as $(2^N-1)$ times that of Cz. Due to process, voltage, and temperature (PVT) variations, the values of the parasitic capacitances (and in some instances, the discrete capacitors themselves) may drift or change. Accordingly, control circuit 13 in the embodiment shown may adjust the value of Cp to maintain the ratio with Cz. In various embodiments, control circuit 19 may receive inputs from, e.g., a power management circuit or from temperature monitoring circuits, and may make adjustments to Cp accordingly.

Figure 2:
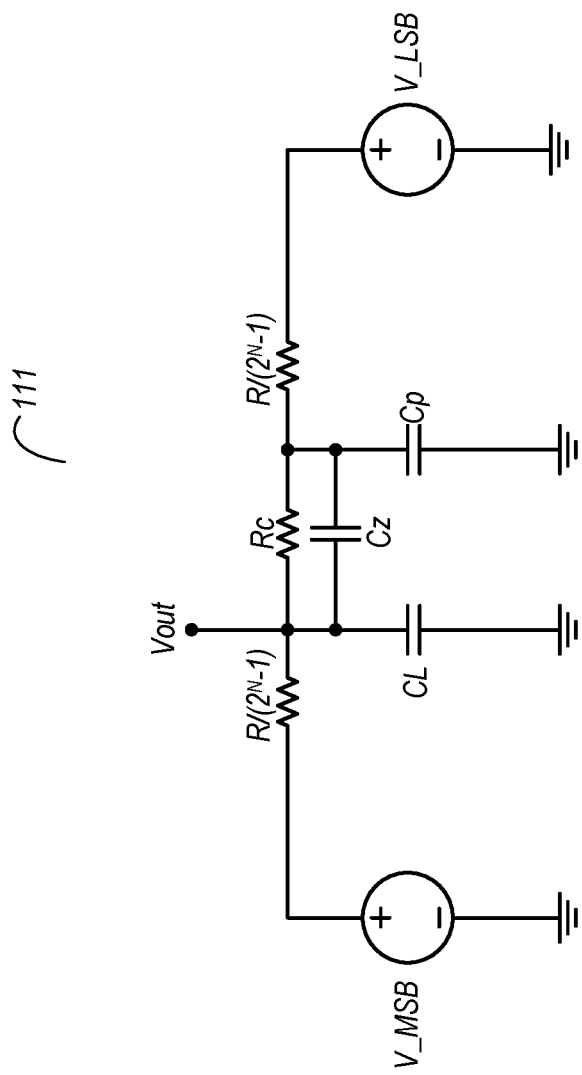
FIG. 2 is a schematic diagram illustrating an equivalent circuit of the R-DAC embodiment of FIG. 1.

FIG. 2 is a schematic diagram illustrating an equivalent circuit of the R-DAC embodiment of FIG. 1. Equivalent circuit 111 in the embodiment shown models MSB DAC 12 as a first voltage source, V_MSB. Similarly, LSB DAC 13 is implemented as a second voltage source, V_LSB. Equivalent circuit 111 also includes two instances of resistance $R/(2^N-1)$. A first instance of this resistance occurs between V_MSB and Vout, while a second instance occurs between V_LSB and one node of coupling resistor Rc. These resistances represent resistance values within the DACs that implement MSB DAC 12 and LSB DAC 13. Equivalent circuit 111 also shows the load capacitor CL, zero capacitor Cz, and pole capacitor Cp.

In practice, there are desired and undesired capacitances in various parts of equivalent circuit 111, and thus, embodiments of an R-DAC (such as R-DAC 11 discussed above). For example, the load capacitance CL is a desired capacitance. Absent the discrete capacitors discussed herein, the capacitances in the positions of Cz and Cp are undesired parasitic capacitances that can distort the analog output signal on Vout. These parasitic capacitances are associated with actual resistors used to implement the R-DAC. In typical CMOS processes, the parasitic capacitances associated with resistors can be high.

Consider an R-DAC with a digital input value of 2N, where N=6, 2N=12, and $2^N$=64. When the parasitic capacitors occurring in the positions of Cz and Cp are negligible, the transfer function of equivalent circuit 111 (and thus, of R-DAC 11), is given by the following (in which the term 's' represents the complex frequency in the s-plane):

$$Vout = \frac{64}{65} \cdot \left(V\_MSB + \frac{V\_LSB}{64}\right) \cdot \frac{1}{1 + \frac{64}{65 \times 63}sRCL}. \qquad \text{(Equation 1)}$$

However, in most practical cases, Cz and Cp are not negligible. When Cz and Cp are not negligible, the transfer function of equivalent circuit 111 becomes the following:

$$Vout = \frac{64}{65} \cdot \left(V\_MSB + \frac{1 + sRCZ}{1 + sR\frac{Cp+Cz}{64}} \cdot \frac{V\_LSB}{64}\right). \qquad \text{(Equation 2)}$$

$$\left(\frac{1 + sR\frac{Cp+Cz}{64}}{\frac{64^2}{65 \times 63}\left(1 + sR\frac{Cp+Cz}{64}\right)\left(1 + sR\frac{CL+Cz}{64}\right) - \frac{1}{65 \times 63}(1 + sRCz)^2}\right).$$

In Equation 2 above, there is a frequency dependent term associated with V_LSB which in the physical realization of the circuit, results in the undesired distortion of the output signal. This term is:

$$\frac{1 + sRCZ}{1 + sR\frac{Cp+Cz}{64}}. \qquad \text{(Term 1)}$$

Note that if Cp and Cz are zero, Equation 2 reduces to Equation 1. Accordingly, many designers of R-DACs try to reduce the parasitic capacitances in the positions of Cp and Cz as close to zero as possible. However, since these parasitic capacitances typically cannot be reduced to zero, the linearity of R-DACs designed under such an approach becomes limited.

If $Cp=63 \times Cz$ (more generally, $Cp=(2^N-1) \times Cz$), then Equation 2 reduces to the following:

$$Vout = \frac{64}{65} \cdot \left(V_{MSB} + \frac{V_{LSB}}{64}\right) \cdot \left(\frac{1}{1 + sR\left(\frac{64CL}{65 \times 63} + \frac{Cz}{65}\right)}\right). \quad \text{(Equation 3)}$$

In light of the observation obtained from reducing Equation 2 to Equation 3 when the capacitance value of Cp is a desired ratio with respect to Cz, the present disclosure contemplates adding capacitors such that total values of Cp and Cz have the desired ratio. That is, when a discrete capacitor is added to the parasitic capacitance for each of Cp and Cz, the overall ratio of these capacitances can be controlled in accordance with Equation 3. This may in turn minimize, if not eliminate, the undesired effect of the parasitic capacitances that would otherwise comprise Cp and Cz in the absence of the added discreet capacitors, namely the distortion of the output signal and non-linear response of the R-DAC. Furthermore, by adding Cp as a variable discreet capacitor, an additional level of control is obtained, thereby allowing the design of the resulting R-DAC to be robust over a wide variety of process, voltage, and temperature variations.

Figure 3:
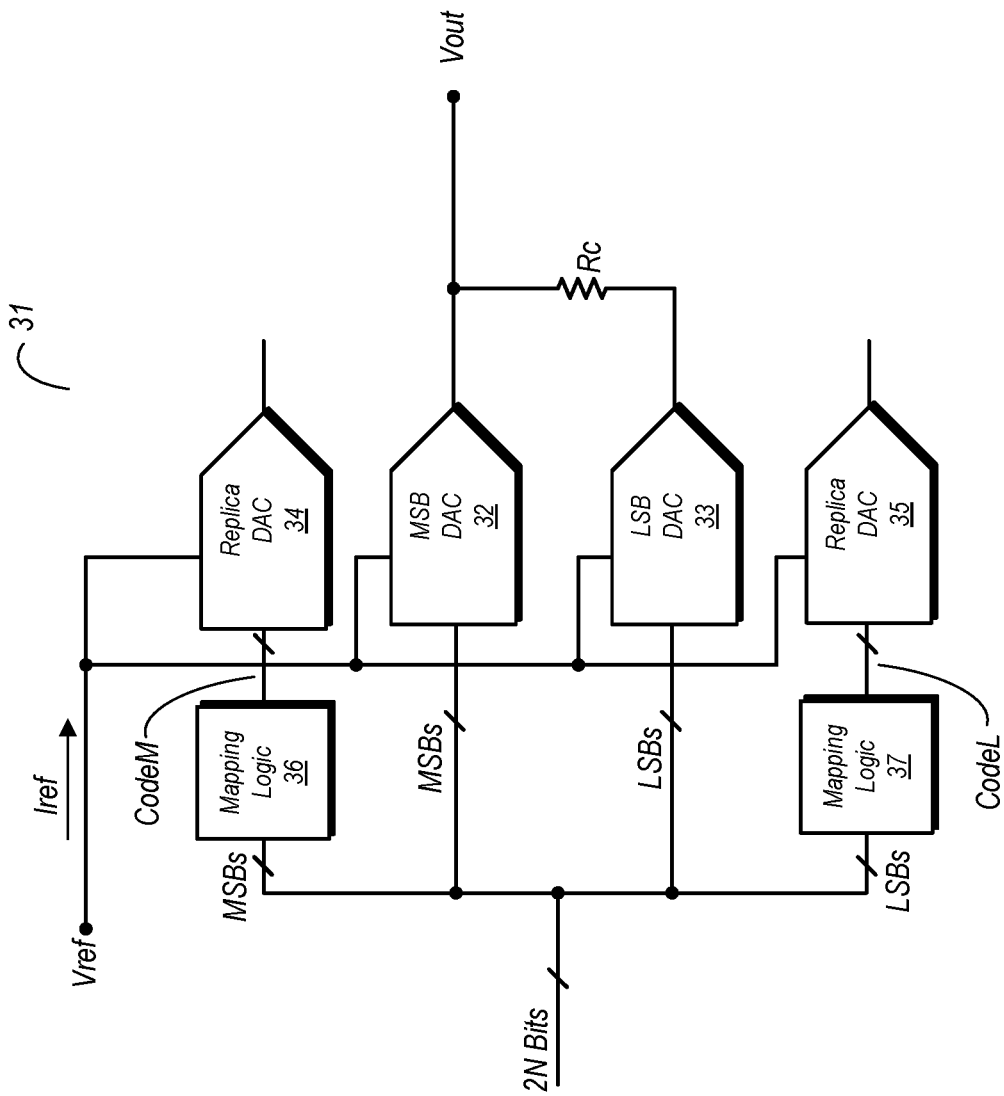
FIG. 3 is a schematic diagram of another embodiment of a segmented R-DAC.

FIG. 3 is a schematic diagram of another embodiment of a segmented R-DAC. In the embodiment shown, R-DAC 31 is arranged to compensate for variations in the reference current (Iref, coming from the reference voltage node, Vref) that can occur due to different input values provided to the circuit. In this embodiment, replica DACs and mapping logic circuits are provided to compensate for these variations such that the overall value of the reference current stays substantially constant or within a specified range. This can improve the linearity of the R-DAC.

R-DAC 31 includes an MSB DAC 32, and an LSB DAC 33, along with coupling resistance Rc. As with the embodiment discussed above, R-DAC 31 is arranged to receive a digital value of 2N bits. In at least some embodiments, this digital value can be divided into N MSBs to be provided to MSB DAC 32, and N LSBs provided to LSB DAC 33.

In addition to MSB DAC 32 and LSB DAC 33, R-DAC 31 in the embodiment shown includes replica DAC 34 and replica DAC 35. Although not necessary for all embodiments, replica DAC 34 has a circuit topology that is the same as that of MSB DAC 32, while LSB DAC 33 and replica DAC 35 also share the same circuit topology. This may significantly simplify the design of R-DAC 31.

R-DAC 31 in the embodiment shown also includes a first mapping logic circuit 36 and a second mapping logic circuit 37. The first mapping logic circuit 36 is coupled to receive the MSBs of the 2N-bit digital input value. Responsive to receiving the MSBs, a first code ('CodeM') is generated and provided to replica DAC 34. The second mapping logic 37 receives the LSBs of the 2N-bit digital value and generates at second code ('CodeL') that is provided to replica DAC 35. The codes provided to replica DACs 34 and 35 cause these DACs to draw on the reference current in such a manner that the overall reference current remains relatively constant over a number of different digital input values that can be provided to R-DAC 31. The particular codes to be generated may be determined by various methods, such as trial and error.

To illustrate further how the replica DACs and corresponding mapping logic circuits can compensate for reference current variations caused by MSB DAC 32 and LSB DAC 33, an understanding of the relationship of the reference current to other circuit values is useful, and is now presented herein.

If the effect of the load capacitor is not considered, Equation 1 as presented above can be rewritten as follows:

$$Vout = \frac{64}{65} \cdot \left(V\_MSB + \frac{V\_LSB}{64}\right). \quad \text{(Equation 4)}$$

V_MSB and V_LSB are the effective output voltages of their respective DAC segments. Individually, these voltages can be expressed as follows:

(Equations 5 and 6, respectively)

$$V_{MSB} = Vref \cdot \frac{D\_MSB}{63} \text{ and } V_{LSB} = Vref \cdot \frac{D\_LSB}{63}.$$

The values D_MSB and D_LSB represent the MSB and LSB digital codes provided to the segmented R-DAC.

In light of Equations 5 and 6, the output voltage provided by the R-DAC can be expressed as:

$$Vout = Vref \cdot \frac{64}{65 \times 63} \cdot \left(D\_MSB + \frac{D\_LSB}{64}\right). \quad \text{(Equation 7)}$$

Equation 7 above assumes a constant value of Vref, irrespective of the values of D_MSB and D_LSB. However, the current load on Vref, Iref, changes with the input code provide to the R-DAC. Furthermore, Vref has a finite output impedance, and thus Vref has a dependency on the load current Iref. This can cause an undesired distortion in the DAC output, Vout. The Iref dependency on the input code, expressed as D_MSB and D_LSB, is as follows:

$$Iref = \frac{Vref}{Rc} \cdot \left(\frac{D\_MSB \cdot (63 - D\_MSB)}{63} + \frac{D\_LSB \cdot (63 - D\_LSB)}{63}\right). \quad \text{(Equation 8)}$$

Since the reference current Iref is dependent on the input code, this input code can also be used to compensate for these variations using the replica DACs. More particularly, the replica DACs can be used to largely cancel the variations that occur in the reference current based on the codes generated by the mapping logic circuit 34 and 35. This operation is now illustrated graphically in FIG. 4.

Figure 4:
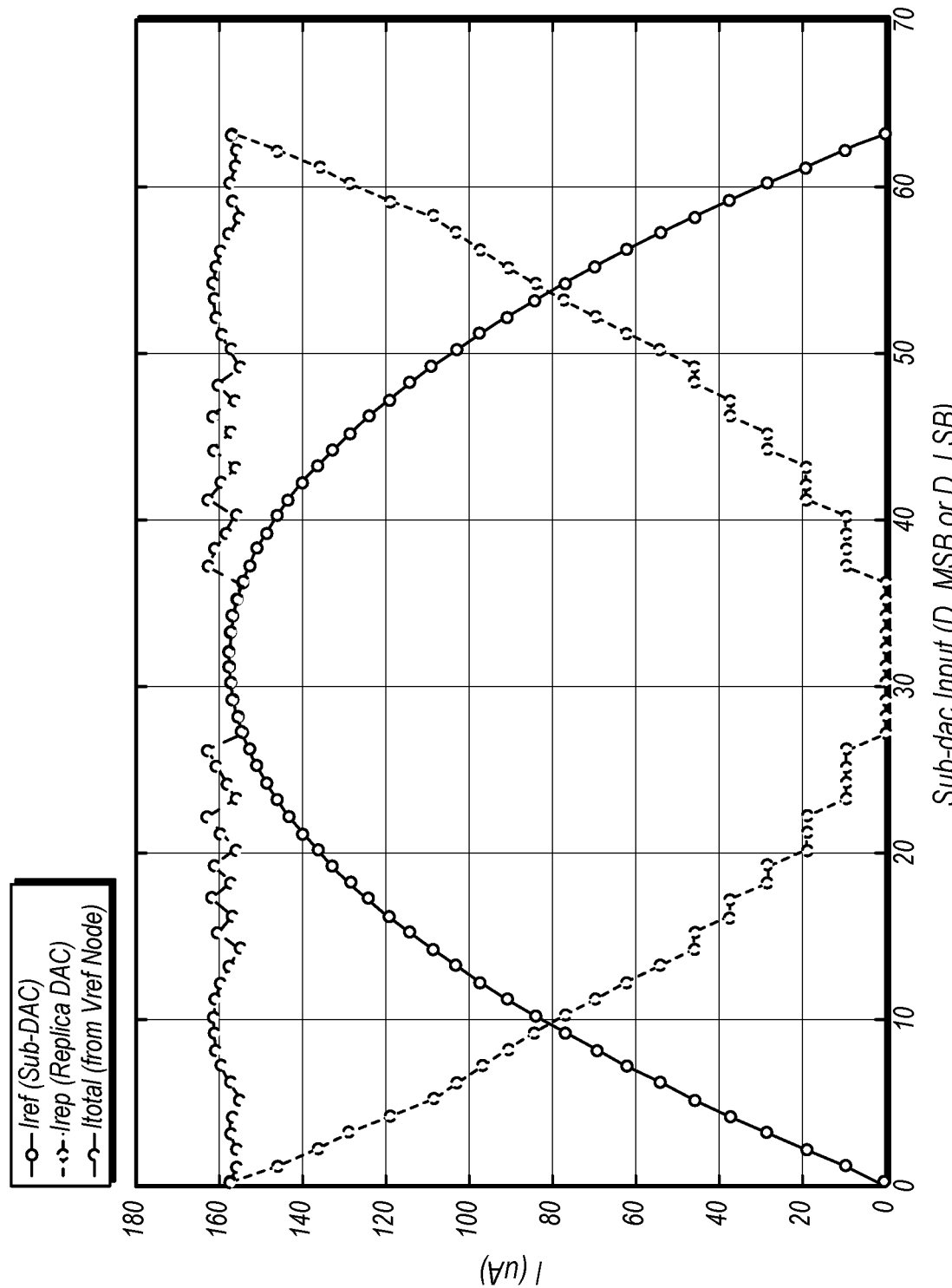
FIG. 4 is a graphic illustration of reference current compensation performed by the embodiment of a segmented R-DAC shown in FIG. 3.

FIG. 4 is a graphic illustration of reference current compensation performed by the embodiment of a segmented R-DAC shown in FIG. 3. FIG. 4 illustrates a current profile for one of the sub-DACs (MSB DAC 32 or LSB DAC 33), its corresponding replica DAC, and the composite effect on the reference current, Iref. The graph of FIG. 4 assumes that each of the DACs receives the same number of bits, N, which is 6 in this case, and thus the digital value (D_LSB or D_MSB) can vary between 0 and 63.

As shown in FIG. 4, the reference current, Iref, drawn by one of the sub-DACs increases between D values between 0 and 31, and then subsequently decreases from 32 to 63. Meanwhile, the reference current drawn by a corresponding replica DAC, Irep, is at its maximum when the input value D is at zero, falling to a minimum in the mid-range values, and then increasing back to its maximum at 63. Since both the sub-DAC and the corresponding replica DAC are drawing current from the same node, these currents are effectively summed together to produce Itotal. This current, Itotal, varies a small amount around a value of 160 μA (micro-amps) in this particular example. Generally speaking, each mapping logic circuit 36 and 37 can be designed such that its correspondingly coupled replica DAC generates a current profile that is the opposite of that generated by its corresponding sub-DAC. Thus, as the reference current drawn by a particular sub-DAC increases, the reference current drawn by a corresponding replica DAC decreases, and vice versa. As a result, the sum of these current, Itotal, as drawn from the reference voltage node Vref, remains substantially constant, varying only a small amount within a specified range.

Figure 5:
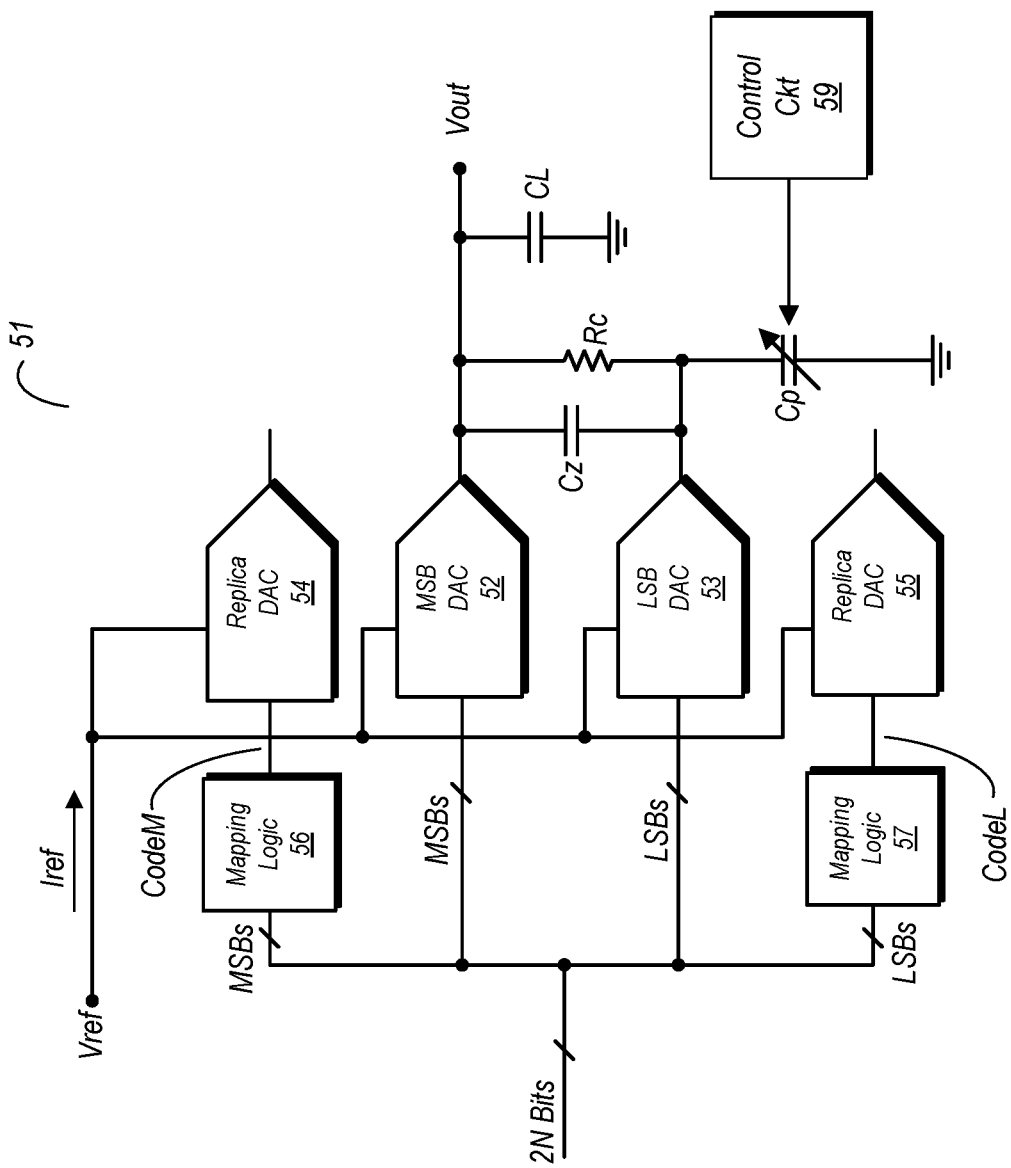
FIG. 5 is a schematic diagram of another embodiment of a segmented R-DAC.

FIG. 5 is a schematic diagram of another embodiment of a segmented R-DAC. In the embodiment shown, R-DAC 51 is a composite of R-DACs 11 and 31 discussed above. R-DAC 51 includes MSB DAC 52, LSB DAC 53, replica DAC 54, replica DAC 55, mapping logic circuit 56, and mapping logic circuit 57. Accordingly, R-DAC 51 is arranged to compensate for the variations in the reference current produced by MSB DAC 52 and LSB DAC 53, as with the embodiment discussed above in reference to FIGS. 3 and 4.

R-DAC 51 also includes added, discrete capacitors Cz and Cp. As with the embodiments discussed above with reference to FIGS. 1 and 2, these capacitors may be arranged such Cp has a capacitance value that is $(2^N-1)$ times that of Cz. Additionally R-DAC 51 also include control circuit 59, which can adjust the capacitance value of Cp in order to maintain the ratio of these two capacitances. Accordingly, R-DAC 51 may also largely eliminate the distortion that would otherwise be produced on the output signal if the discreet capacitors Cp and Cz were not added and the effects of the parasitic capacitances discussed above were not subject to adequate compensation. As a result of combining the two solutions discussed above into a single embodiment of R-DAC 51, the resulting circuit may have very good linearity over a wide range of operating conditions and input values.

Figure 6:
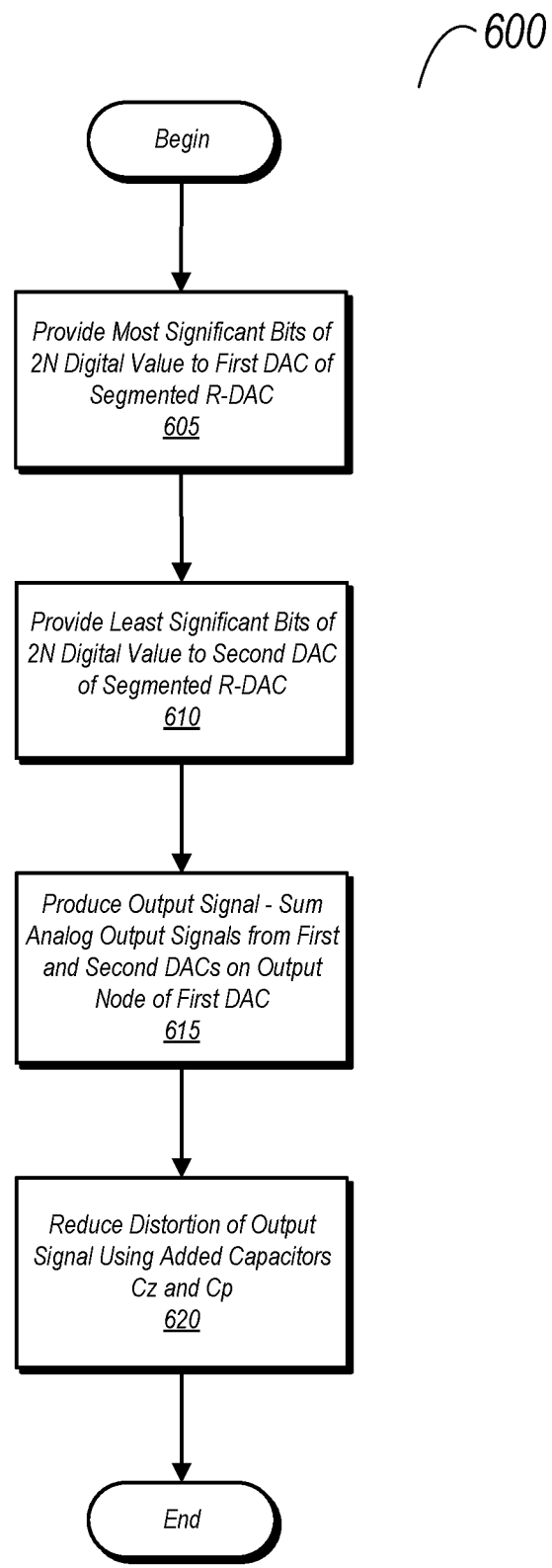
FIG. 6 is a flow diagram illustrating operation of one embodiment of an R-DAC.

FIG. 6 is a flow diagram illustrating operation of one embodiment of an R-DAC. Method 600 as illustrated herein applies to embodiments of an R-DAC that include the discreet capacitors Cp and Cz to cancel the effects of the corresponding parasitic capacitances. Accordingly, Method 600 as illustrated in FIG. 6 may apply to, e.g., R-DAC 11 of FIG. 1, as well as the composite embodiment of R-DAC 51 shown in FIG. 5.

Method 600 begins with the providing of the MSBs of a digital value having 2N bits to a first (MSB) DAC (block 605), and providing the LSBs of the digital value to a second (LSB) DAC (block 610). Method 600 further includes producing an output signal by summing analog output signals from the first and second DACs on the output node of the first DAC (block 615). The method also includes reducing distortion of the output signal using added (discrete) capacitors Cz and Cp (block 620), such as those shown in FIG. 1. These capacitors are not inherent or parasitic capacitances. Instead, the capacitors Cz and Cp are added capacitors. Although there is some parasitic capacitance on the nodes associated with these capacitors, the addition of discrete capacitors at these nodes enables controlling the overall capacitance values. Furthermore, the addition of these capacitors enables controlling the ratio of capacitance between Cp and Cz, which can minimize the distortion of the output signal, as discussed above.

Figure 7:
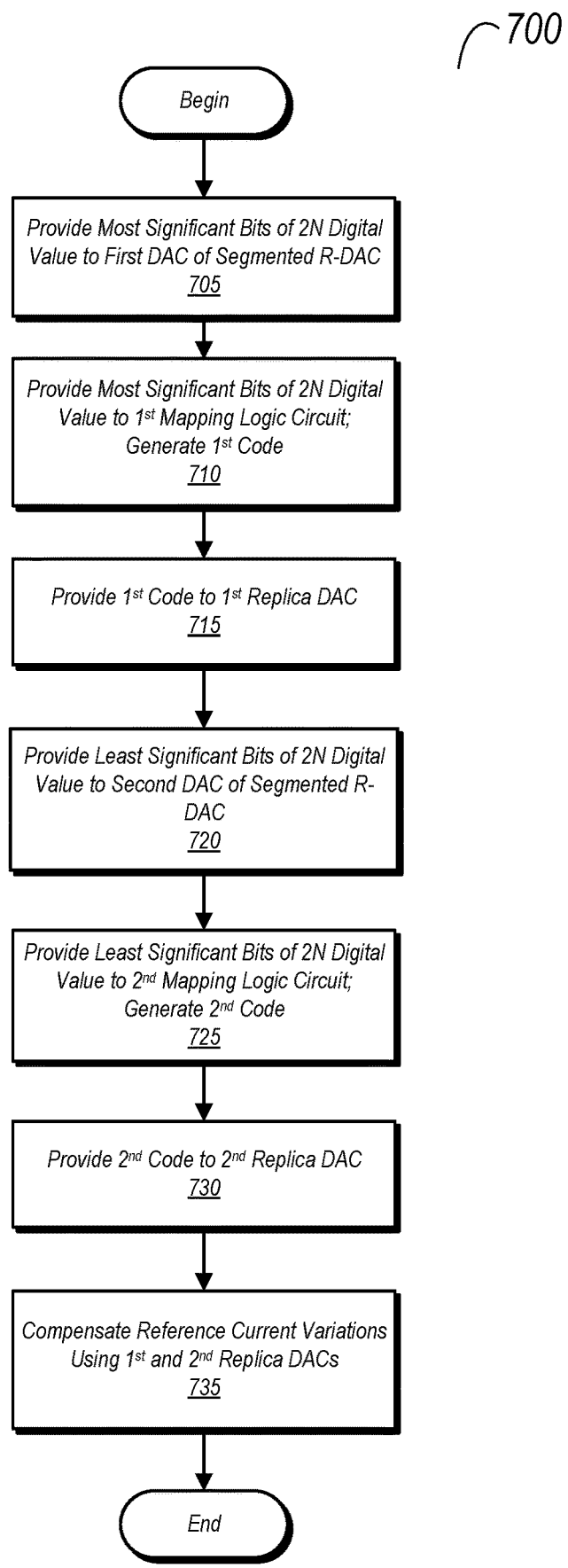
FIG. 7 is a flow diagram illustrating operation of another embodiment of an R-DAC.

FIG. 7 is a flow diagram illustrating operation of another embodiment of an R-DAC. Method 700 as illustrated in FIG. 7 may be performed with various embodiments of a segmented R-DAC as discussed above, such as those shown in FIGS. 3 and 5.

Method 700 begins with providing the MSBs of a 2N digital value to a first (MSB) DAC of a segmented R-DAC (block 705). The MSBs of the 2N digital value are also provided to a $1^{st}$ mapping logic circuit to generate a first code (block 710), which in turn, results in the mapping logic circuit providing the first code to a first replica DAC (block 715). Method 700 further includes providing LSBs of the 2N digital value to a second (LSB) DAC of the segmented R-DAC (block 720). The LSBs are also provided to a second mapping logic circuit to generate a second code (block 725), with the second code being provided to a second replica DAC.

Each of the MSB and LSB DACs as well as the replica DACs are coupled to a reference voltage node and thus receive a reference current therefrom. Due to the structure of the DACs, the reference current can vary with the inputs provided thereto. These variations, if left uncompensated, can affect the performance of the segmented R-DAC. Accordingly, the first and second replica DACs, responsive to their respectfully received codes, compensate for variations induced by the MSB and LSB DACs (block 735), thereby keeping the overall reference current relatively constant over the range of input values that can be provided to the segmented R-DAC.

Figure 8:
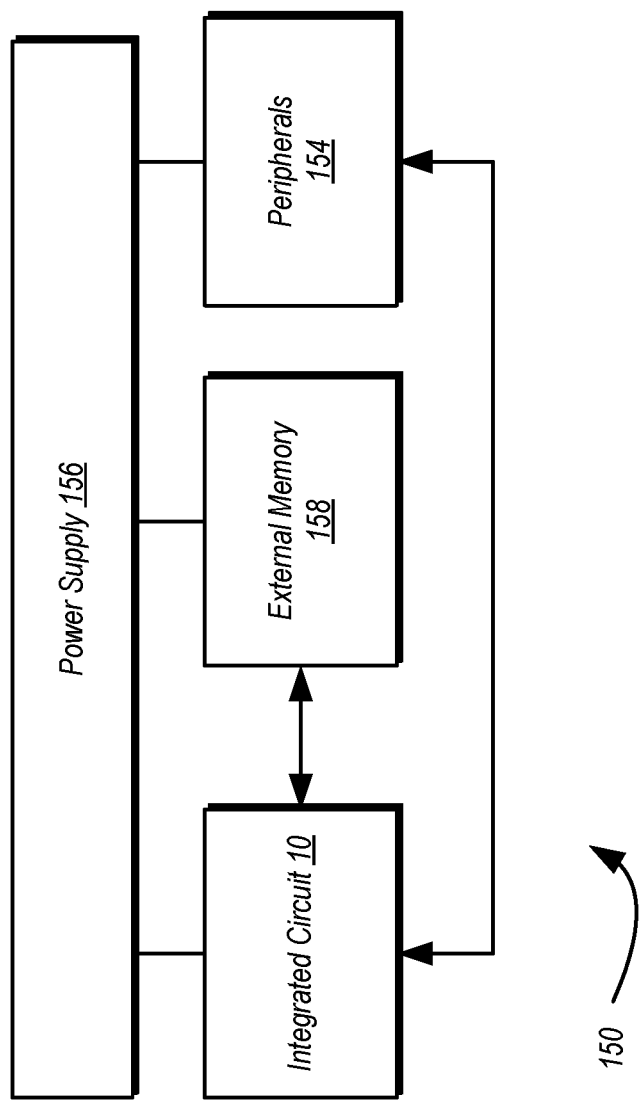
FIG. 8 is a block diagram of one embodiment of an example system.

Turning next to FIG. 8, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

System 150 in the embodiment shown may include one or more instances of a segmented R-DAC in any of the various embodiments discussed above. For example, peripherals 154 may include one or more wireless transceivers that convert digital information into an analog format. Such wireless transceivers may implement one or more of the segmented R-DAC embodiments discussed above to perform the desired conversions to analog.

Numerous variations and modifications will become apparent to those skilled in the art once the above disclosure is fully appreciated. It is intended that the following claims be interpreted to embrace all such variations and modifications.

What is claimed is:

1. A circuit comprising:
    a first digital-to-analog converter (DAC) coupled to receive a group of most significant bits (MSBs) of a digital value having 2N bits, wherein N is a integer number;
    a second DAC coupled to receive a group of least significant bits (LSBs) of the digital value;
    a first capacitor coupled between an output of the first DAC and an output of the second DAC; and
    a second capacitor coupled between the output of the second DAC and a ground node, wherein a capacitance value of the second capacitor is a predetermined number times a capacitance value of the first capacitor.

2. The circuit of claim 1, wherein the second capacitor is a variable capacitor adjustable to compensate for process, voltage, and temperature variations.

3. The circuit of claim 2, further comprising a control circuit configured to set the capacitance value of the second capacitor.

4. The circuit of claim 1, wherein the group of most significant bits comprises N bits, and wherein the group of least significant bits comprises N bits.

5. The circuit of claim 1, wherein the capacitance value of the second capacitor is $(2^N-1)$ times the capacitance value of the first capacitor.

6. The circuit of claim 1, further comprising a reference voltage node coupled to provide a reference voltage to the first and second DACs.

7. The circuit of claim 1, further comprising:
    a first replica DAC having a circuit topology corresponding to a circuit topology of the first DAC; and
    a second replica DAC having a circuit topology corresponding to a circuit topology of the second DAC.

8. The circuit of claim 7, further comprising:
    a first mapping logic circuit configured to provide a first code to the first replica DAC, wherein the first code is generated based on the MSBs; and
    a second mapping logic circuit configured to provide a second code to the second replica DAC, wherein the second code is generated based on the LSBs.

9. The circuit of claim 8, wherein the first and second replica DACs are configured to compensate for variations to a reference current provided to the first and second DACs based on the first and second codes, respectively.

10. A method comprising:
    providing a group of most significant bits (MSBs) of a digital value to a first digital-to-analog converter (DAC) and a first mapping logic circuit, wherein the digital value comprises 2N bits, wherein N is an integer value;
    providing a group of least significant bits (LSBs) of the digital value to a second DAC and a second mapping logic circuit;
    providing a first code from the first mapping logic circuit to a third DAC;
    providing a second code from the second mapping logic circuit to a fourth DAC;
    summing first and second output signals from the first and second DACs to generate an analog output signal; and
    compensating for variations in a reference current provided to the first and second DACs using the third and fourth DACs.

11. The method of claim 10, wherein a first capacitor is coupled between an output of the first DAC and an output of the second DAC, and wherein the method further comprises:
    adjusting a value of a second capacitor for process, voltage, and temperature variations such that a capacitance value of the second capacitor is $(2^N-1)$ times a value of the first capacitor, wherein the second capacitor is coupled between the output of the second DAC and a ground node.

12. The method of claim 10, wherein the group of MSBs and the group of LSBs each include N bits.

13. A circuit comprising:
    a segmented resistive digital-to-analog converter (R-DAC) including:
        a first digital-to-analog converter (DAC) coupled to receive N most significant bits of a digital value having 2N bits, wherein N is a integer number;
        a second DAC coupled to receive N least significant bits of the digital value;
        a first mapping logic circuit configured to generate a first digital code based on the N most significant bits;
        a third DAC coupled to receive the first digital code;
        a second mapping logic circuit configured to generate a second digital code based on the N least significant bits; and
        a fourth DAC coupled to receive the second digital code.

14. The circuit of claim 13, wherein the first and third DACs have an identical circuit topology, and wherein the second and fourth DACs have an identical circuit topology.

15. The circuit of claim 13, wherein the third and fourth DACs are configured to, based on the first and second codes, compensate for variations to a reference current provided to the first and second DACs.

16. The circuit of claim 13, further comprising:
    a first capacitor coupled between an output of the first DAC and an output of the second DAC; and
    a second capacitor coupled between the output of the second DAC and a ground node.

17. The circuit of claim 16, wherein the second capacitor has a capacitance value that is $(2^N-1)$ times a capacitance value of the first capacitor.

18. The circuit of claim 16, wherein the second capacitor is a variable capacitor.

19. The circuit of claim 18, further comprising a control circuit coupled to adjust a capacitance value of the second capacitor responsive to process, voltage, and temperature variations such that the second capacitor maintains its capacitance value as being $(2^N-1)$ times the capacitance value of the first capacitor.

20. The circuit of claim 13, further comprising a coupling resistor coupled between an output of the first DAC and an output of the second DAC, wherein an analog output signal is provided by the segmented R-DAC from the output of the first DAC.

* * * * *